United States Patent
Ueda

(10) Patent No.: US 6,952,250 B2
(45) Date of Patent: Oct. 4, 2005

(54) PRESSURE-WELDED STRUCTURE OF FLEXIBLE CIRCUIT BOARDS

(75) Inventor: Hiroshi Ueda, Kumamoto (JP)

(73) Assignee: Advanced Display Inc., Kumamoto (JP)

( * ) Notice: Subject to any disclaimer, the term of this patent is extended or adjusted under 35 U.S.C. 154(b) by 0 days.

(21) Appl. No.: 10/280,942

(22) Filed: Oct. 25, 2002

(65) Prior Publication Data

US 2003/0094305 A1    May 22, 2003

(30) Foreign Application Priority Data

Oct. 29, 2001  (JP) .............................. 2001-331040

(51) Int. Cl.$^7$ ........................................... G02F 1/1345
(52) U.S. Cl. ..................... 349/150; 349/149; 349/151; 349/152
(58) Field of Search .............................. 349/149, 150, 349/151, 152

(56) References Cited

U.S. PATENT DOCUMENTS

| | | | | |
|---|---|---|---|---|
| 5,672,400 A | * | 9/1997 | Hansen et al. ............. | 428/40.1 |
| 5,949,512 A | * | 9/1999 | Taguchi ..................... | 349/150 |
| 6,086,441 A | * | 7/2000 | Akiguchi et al. ........... | 445/24 |
| 6,211,469 B1 | * | 4/2001 | Taguchi ..................... | 174/260 |
| 6,424,400 B1 | * | 7/2002 | Kawasaki .................. | 349/149 |
| RE37,945 E | * | 12/2002 | Kanezawa .................. | 349/149 |

FOREIGN PATENT DOCUMENTS

JP          10-123 555 A        5/1998

OTHER PUBLICATIONS

Patent Abstracts of Japan, English abstract of JP 10-123 555-A, Nomura+/Matsushita (2 pp., ©1998, Japan Patent Office).

Six-page English partial translation of JP Unexamined Patent Publication 123,555/1998.

* cited by examiner

*Primary Examiner*—Tarifur R. Chowdhury
*Assistant Examiner*—Michael H. Caley
(74) *Attorney, Agent, or Firm*—Milton Oliver, Esq.; Ware Fressola Van Der Sluys & Adolphson LLP

(57) ABSTRACT

A pressure-welded structure of flexible circuit boards in a liquid crystal display device having a group of lead terminals of flexible circuit boards connected with a plurality of terminals aligned on an end surface of a TFT glass substrate via anisotropic conductive films. A resin is applied on a surface opposite to the terminal surface of the flexible circuit boards, and an end portion of the resin is 0.1 to 10 mm away from an end portion of a resin applied on the terminal surface of the flexible circuit boards, thereby both resins applied on the terminal surface and on the other surface overlap each other by 0.1 to 10 mm. It is possible to improve not only the yield in module assembly but also the quality and reliability of the product.

4 Claims, 2 Drawing Sheets

PRESSURE-WELDED STRUCTURE OF FLEXIBLE CIRCUIT BOARDS

BACKGROUND OF THE INVENTION

The present invention relates to a pressure-welded structure of flexible circuit boards. More specifically, it relates to a pressure-welded structure of flexible circuit boards for mounting circuit boards which allows the flexible circuit boards to be connected to the leads of an electronic component by pressing a tool for thermo-compression bonding against the leads.

Example of a technique for mounting circuit boards with the use of thermo-compression bonding is a technique for mounting IC modules in a liquid crystal display device. A liquid crystal display device is generally structured by connecting a liquid crystal panel, which consists of two glass substrates and liquid crystal disposed therebetween, to a driving circuit and superposing the liquid crystal panel on a lighting device. In general, a driving circuit for TFT (thin film transistor) liquid crystal panel modules is composed of tape-shaped flexible circuit boards on which LSIs to drive TFTs are equipped, and printed circuit boards (PCB) which transmit electric power and image signals to the flexible circuit boards. FIG. 3 shows the structure of general TFT liquid crystal modules and a driving circuit unit. Reference numeral 1 denotes a TFT glass substrate having source electrodes and gate electrodes; reference numeral 2 denotes a color filter glass substrate having a color filter; reference numeral 3, 4 denote anisotropic conductive films (ACF) having conductive particles dispersed in an adhesive agent; reference numeral 5 denotes a driving LSI; reference numeral 6 denotes flexible circuit board which include the driving LSI 5 thereon and have input terminals and output terminals; and reference numeral 7 denotes a printed circuit board. The anisotropic conductive film 3 is adhered on the terminal area of the TFT glass substrate 1, and the flexible circuit boards 6 are temporarily pressure-welded one by one to be aligned thereon. Then, a heating tool is used to apply heat to a plurality of flexible circuit boards 6 aligned on one end surface of the TFT glass substrate 1 so as to connect all the boards 6 to the TFT glass substrate 1 at one time by pressure welding. Pressure welding is carried out at one time to a plurality of flexible circuit boards 6 aligned on one end surface of the TFT glass substrate 1 so as to reduce the number of manufacturing process. The flexible circuit boards 6 are classified into a TCP (Tape Carrier Package) and a COF (Chip On Film), both of which are composed of a polyimide film as the base material, and copper foil which is formed thereon to form a circuit pattern (copper foil pattern) 10 by a photolithography. A resin called a solder resist 8 is applied on the surface of the circuit pattern 10 except for the region to be connected to the TFT glass substrate 1 in order to maintain electrical insulation of the circuit and to protect the circuit from foreign materials (refer to FIG. 1).

However, in the flexible circuit boards 6, when the boards 6 are bent, stress is concentrated on the area between the end portion of the TFT glass substrate 1 and the end portion of the solder resist 8 on the circuit pattern 10, which is likely to cause circuit breaks in the circuit pattern 10. For example, this break is likely to occur by the bend of the flexible circuit boards 6 when the modules are assembled after the flexible circuit boards 6 are connected to the TFT glass substrate 1, or at the time of handling by human hands.

SUMMARY OF THE INVENTION

In view of the above-described situation, it is an object of the present invention to provide a pressure-welded structure of flexible circuit boards which prevents the occurrence of circuit breaks due to the stress applied on the region between the end portion of the TFT glass substrate and the end portion of the solder resist on the side of the circuit pattern when the flexible circuit boards are bent.

In accordance with the present invention, there is provided a pressure-welded structure of flexible circuit boards in a liquid crystal display device having a group of lead terminals of flexible circuit boards connected with a plurality of terminals aligned on an end surface of a TFT glass substrate via anisotropic conductive films, wherein a resin is applied on a surface opposite to the terminal surface of the flexible circuit boards, and an end portion of the resin is 0.1 to 10 mm away from an end portion of a resin applied on the terminal surface of the flexible circuit boards, thereby both resins applied on the terminal surface and on the other surface overlap each other by 0.1 to 10 mm.

In accordance with the present invention, there is also provided a pressure-welded structure of flexible circuit boards in a liquid crystal display device having a group of lead terminals of flexible circuit boards connected with a plurality of terminals aligned on a surface of a printed circuit board via anisotropic conductive films, wherein a resin is applied on a surface opposite to the terminal surface of the flexible circuit boards, and an end portion of the resin is 0.1 to 10 mm away from an end portion of a resin applied on the terminal surface of the flexible circuit boards, thereby both resins applied on the terminal surface and on the other surface overlap each other by 0.1 to 10 mm.

DETAILED DESCRIPTION

The pressure-welded structures of the flexible circuit boards of the present invention will be described hereinafter based on the attached drawings.

EMBODIMENT 1

Figure 1:
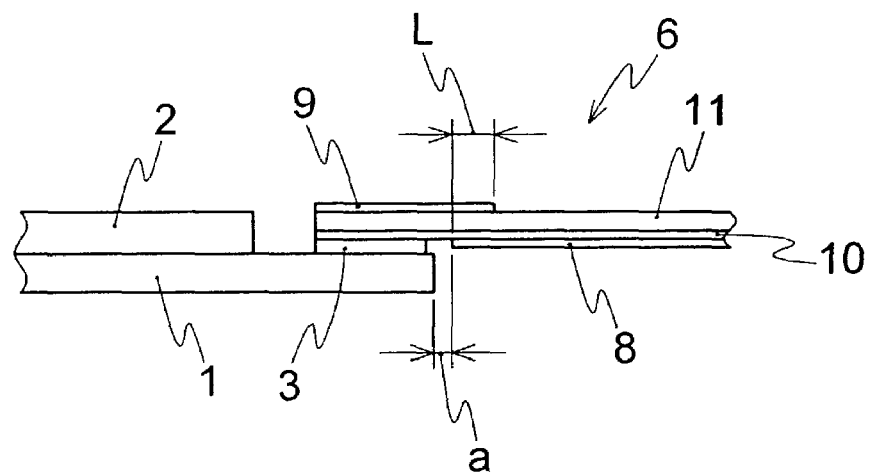
FIG. 1 is a view showing the pressure-welded structure of a TFT glass substrate and a flexible circuit board according to Embodiment 1 of the present invention.
Figure 3:
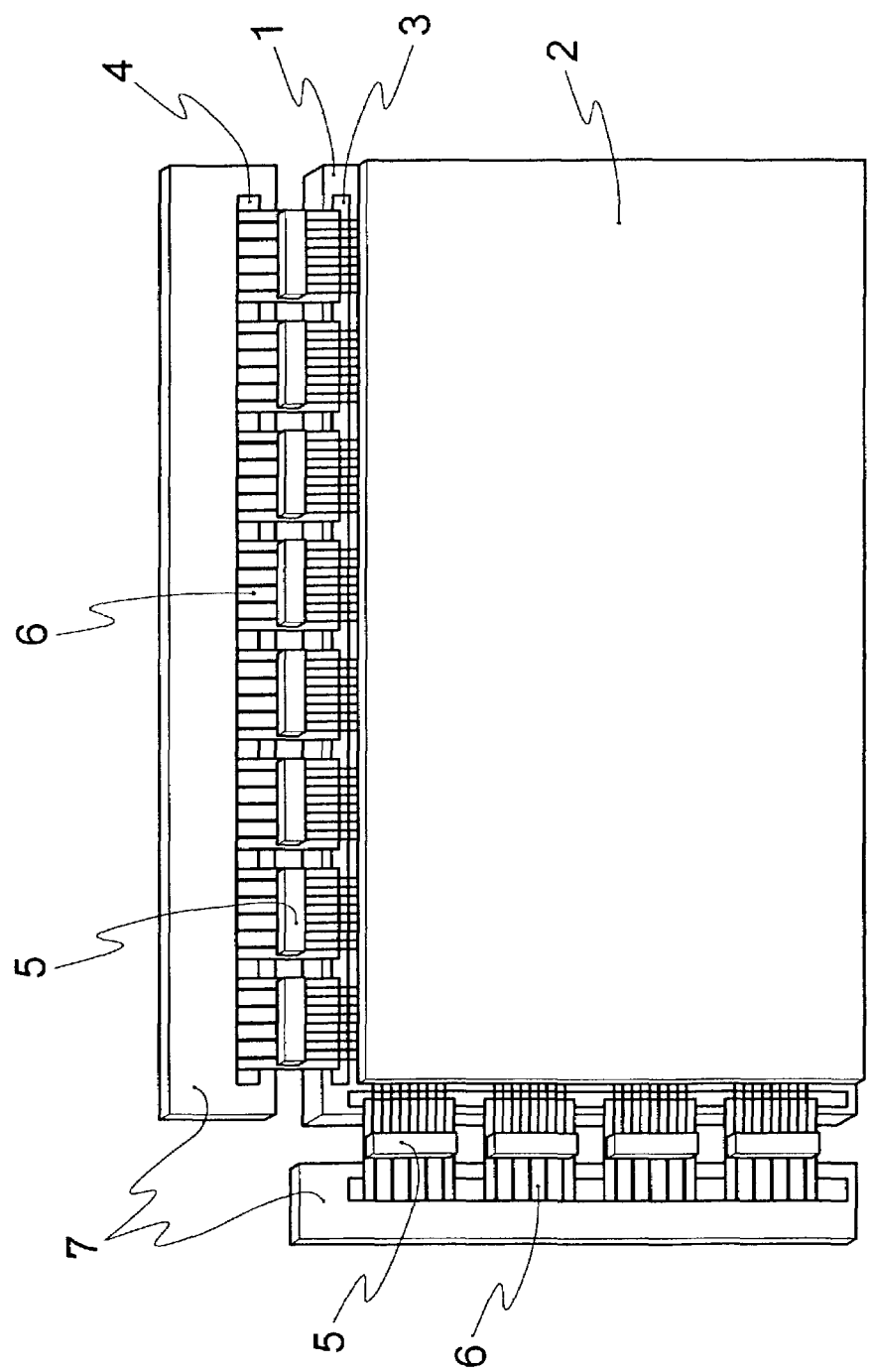
FIG. 3 is a view showing the structure of TFT liquid crystal panel modules and a driving circuit unit.

The TFT liquid crystal panel modules used in the pressure-welded structure of the flexible circuit boards of the present invention have the same structure as the TFT liquid crystal panel modules shown in FIG. 3. As shown in FIG. 1, a plurality of terminals aligned on an end surface of the TFT glass substrate 1 are connected to a group of lead terminals of the flexible circuit boards 6 via an anisotropic conductive film 3 by applying heat and pressure (thermo-compression bonding) to bring them into conduction. The flexible circuit boards 6 have a circuit pattern (copper foil pattern) 10 on a polyimide tape 11, and a solder resist 8 is applied on the surface side or the terminal surface side of the circuit pattern 10. In the flexible circuit boards 6 thus structured, a resin 9 for break prevention is applied on the other side of the terminal surface, which is connected to the TFT glass substrate 1 for preventing the break. The end portion of the solder resist 8 is apart from the end portion of the TFT glass substrate 1 by 0.02 to 0.5 mm, which is the distance of measurement "a", and the end portion of the resin 9 for break prevention is apart or away from the end portion of the solder resist 8 by 0.1 to 10 mm, which is the distance of measurement "L", so that the solder resist 8 and the resin 9 for break prevention overlap each other by 0.1 to 10 mm. In the present invention, the minimum length of the overlapped amount is set at 0.1 mm since the solder resist 8 has a minimum applying precision of 0.1 mm or so. On the other hand, the maximum length of the overlapped amount is set at 10 mm since as the length of the overlapped portion gets longer, more stress is applied on the end portion of the solder resist 8 if an external pressure is applied on the overlapped region. Thus, when the length exceeds 10 mm, frequency of a break becomes high.

In Embodiment 1 according to the present invention, the solder resist 8 and the resin 9 for break prevention overlap each other by 0.1 to 10 mm to increase the stiffness in the portion where the copper foil is exposed between the end portion of the solder resist 8 and the end portion of the TFT glass substrate 1, which prevents stress from concentrating on the exposed region of the circuit pattern 10 when the flexible circuit boards 6 are bent, thereby avoiding circuit break.

Applying the resin 9 for break prevention can be done either before or after connecting the flexible circuit boards 6 to the TFT glass substrate 1.

EMBODIMENT 2

Figure 2:
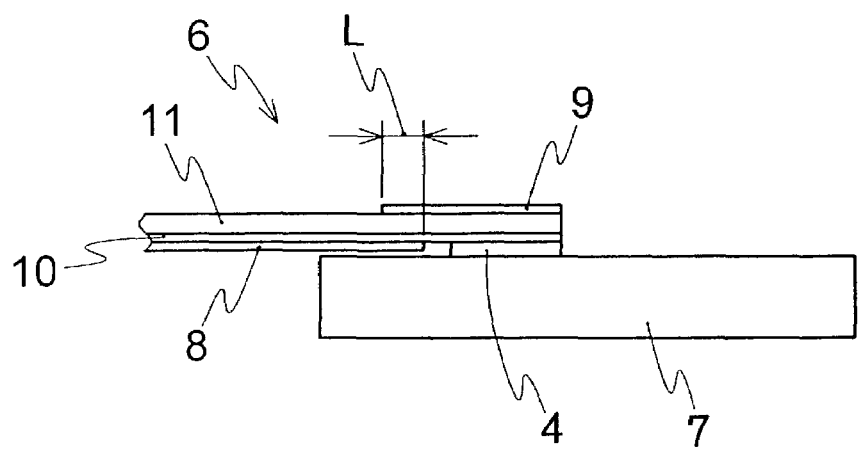
FIG. 2 is a view showing the pressure-welded structure of a printed circuit board and a flexible circuit board according to Embodiment 2 of the present invention.

Next, the pressure-welded structure of the flexible circuit boards according to Embodiment 2 of the present invention will be described. In Embodiment 2, the flexible circuit boards 6 are connected on the printed circuit boards 7 via an anisotropic conductive film 4 by applying heat and pressure (thermo-compression bonding) as shown in FIG. 2. A solder resist 8 is applied on the terminal surface side of the flexible circuit boards 6. As is the case with Embodiment 1, in the flexible circuit boards 6, a resin 9 for break prevention is applied on the other side of the terminal surface which is connected to the circuit boards 6. As is the case with Embodiment 1, the end portion of the resin 9 for break prevention is apart or away from the end portion of the solder resist 8 on the terminal surface side by 0.1 to 10 mm, which is the distance of measurement "L", so that the resist solder 8 and the resin 9 for break prevention overlap each other by 0.1 to 10 mm.

In embodiment 2 according to the present invention, the solder resist 8 and the resin 9 for break prevention overlap each other by 0.1 to 10 mm to increase the stiffness in the portion where the circuit pattern 10 is exposed between the junction of the end portion of the flexible circuit boards 6 and the printed circuit boards 7 and the solder resist 8, which prevents the exposed portion of the circuit pattern 10 from causing a circuit break.

Applying the resin 9 for break prevention can be done either before or after connecting the flexible circuit boards 6 to the printed circuit boards 7.

The resin 9 for break prevention used in Embodiments 1 and 2 can be one which is selected from the group consisting of an epoxy resin, a polyimide resin, a urethane resin, and a silicone resin.

In addition, for the resin 9 for break prevention, a resin with a higher coefficient of elasticity (stiffness) than the solder resist 8 on the terminal surface side is preferably used in Embodiments 1 and 2, and if a resin with a low coefficient of elasticity is used, it is preferable to apply the resin thicker than the solder resist 8. For example, in the case where the solder resist 8 is made from a urethane resin and approximately 25 $\mu$m thick, the resin 9 for break prevention can be made from the same urethane resin and thicker than 25 $\mu$m, e.g. 35 $\mu$m, or can be made from a different resin such as an epoxy resin not thicker than 25 $\mu$m and with a high coefficient of elasticity.

As described hereinbefore, according to the present invention, like connection of the circuit boards, for example, in a liquid crystal display device, when flexible circuit boards are bent after flexible circuit boards are connected to a TFT glass substrate and printed circuit boards, the occurrence of a circuit break can be prevented. It might be possible to improve not only the yield in module assembly but also the quality and reliability of the product.

What is claimed is:

1. A pressure-welded structure of flexible circuit boards in a liquid crystal display device having lead terminals of flexible circuit boards each having a terminal surface connected with a plurality of terminals aligned on an end surface of a TFT glass substrate via anisotropic conductive films, wherein a stiffening layer of resin having a substantially uniform thickness is applied on a surface opposite to the terminal surface of each flexible circuit board, and an end portion of the resin is 0.1 to 10 mm away from an end portion of a resin applied on the terminal surface of each flexible circuit board, whereby the respective resins applied on the terminal surface and on the other surface overlap each other by 0.1 to 10 mm and wherein the resin applied on the surface opposite to the terminal surface is about 40 percent thicker than the resin applied to the terminal surface.

2. The pressure-welded structure of claim 1, wherein the resin applied on the terminal surface is about 25 $\mu$m thick and the resin applied on the surface opposite to the terminal surface is a resin layer about 35 $\mu$m thick.

3. A pressure-welded structure of flexible circuit boards in a liquid crystal display device having lead terminals of flexible circuit boards each having a terminal surface connected with a plurality of terminals aligned on a surface of a printed circuit board via an anisotropic conductive film, wherein a stiffening layer of resin having a substantially uniform thickness is applied on a surface opposite to the terminal surface of each flexible circuit board, and an end portion of the resin is 0.1 to 10 mm away from the end portion of a resin applied on the terminal surface, whereby the respective resins applied on the terminal surface and on the opposite surface overlap each other b 0.1 to 10 mm, and wherein the resin applied on the surface opposite to the terminal surface is about 40 percent thicker than the resin applied to the terminal surface.

4. The pressure-welded structure of claim 3, wherein the resin applied on the terminal surface is about 25 $\mu$m thick and the resin applied on the surface opposite to the terminal surface is a resin layer about 35 $\mu$m thick.

* * * * *

UNITED STATES PATENT AND TRADEMARK OFFICE
CERTIFICATE OF CORRECTION

PATENT NO. : 6,952,250 B2 Page 1 of 1
APPLICATION NO. : 10/280942
DATED : October 4, 2005
INVENTOR(S) : Hiroshi Ueda It is certified that error appears in the above-identified patent and that said Letters Patent is hereby corrected as shown below:

1. Col. 3, line 66, before "resin" insert --stiffening--

2. Col. 3, line 66, after "resin" insert --layer--

3. Col. 3, line 67, delete "with" insert --of--

4. Col. 4, line 1, after "resist" insert --layer--

5. Col. 4, line 3, after "resin" insert --layer--

6. Col. 4, line 4, after "resist" insert --layer--

7. Col. 4, line 5, after "resist", insert --layer--

8. Col. 4, line 6, after "resin" insert --layer--

9. Col. 4, line 7, after "made" insert --with a substantially uniform thickness--

10. Col. 4, line 58, claim 3, line 14, "b" should be --by--

Signed and Sealed this

Twenty-fourth Day of June, 2008

JON W. DUDAS
*Director of the United States Patent and Trademark Office*